(12) United States Patent
Tsuboi et al.

(10) Patent No.: US 10,058,019 B2
(45) Date of Patent: Aug. 21, 2018

(54) BONDING APPARATUS

(71) Applicant: Panasonic Corporation, Osaka (JP)

(72) Inventors: Yasutaka Tsuboi, Yamanashi (JP);
Akira Yamada, Yamanashi (JP);
Toshihiko Tsujikawa, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 683 days.

(21) Appl. No.: 14/498,002

(22) Filed: Sep. 26, 2014

(65) Prior Publication Data
US 2015/0096687 A1    Apr. 9, 2015

(30) Foreign Application Priority Data

Oct. 9, 2013 (JP) ................... 2013-211543

(51) Int. Cl.
*H05K 13/08* (2006.01)
*H05K 13/04* (2006.01)

(52) U.S. Cl.
CPC ......... *H05K 13/0469* (2013.01); *H05K 13/08* (2013.01)

(58) Field of Classification Search
CPC .............. H05K 13/0469; H05K 13/08; B32B 38/0008; B32B 41/00
See application file for complete search history.

(56) References Cited

U.S. PATENT DOCUMENTS

| | | |
|---|---|---|
| 6,256,118 B1 | 7/2001 | Moriarty |
| 2004/0026023 A1 | 2/2004 | DeMeter |
| 2008/0011416 A1 | 1/2008 | DeMeter |
| 2013/0027690 A1* | 1/2013 | Nomaru ............... G01J 1/4257 356/121 |

FOREIGN PATENT DOCUMENTS

| | | | |
|---|---|---|---|
| CN | 1688440 A | | 10/2005 |
| JP | 09018772 A | * | 1/1997 |
| JP | 09-069543 A | | 3/1997 |
| JP | 09069543 A | * | 3/1997 |
| JP | 2000-115456 A | | 4/2000 |
| JP | 2003003146 A | * | 1/2003 |

OTHER PUBLICATIONS

Office Action issued in Chinese Patent Application No. 201410513660.X dated Apr. 27, 2017.

* cited by examiner

*Primary Examiner* — Daniel McNally
(74) *Attorney, Agent, or Firm* — Pearne & Gordon LLP

(57) ABSTRACT

A bonding apparatus includes: a backup unit including a light-transmissive transmission member having a support surface which supports at least a bonding region of a light-transmissive board from below; a pressure-bonding unit which presses an electronic component placed on the bonding region via a photo-curable adhesive agent; and a light irradiation unit which irradiates the supporting surface with light which promotes hardening of the adhesive agent. The electronic component is bonded to the board by pressing the electronic component mounted on a top surface of the adhesive agent in a state in which light from the light irradiation unit is incident upon the adhesive agent through the supporting surface. The bonding apparatus further includes a light distribution measuring unit which measures a distribution of light from the light irradiation portion in the supporting surface.

3 Claims, 8 Drawing Sheets

BONDING APPARATUS

BACKGROUND

1. Technical Field

An aspect of the present invention relates to a bonding apparatus that bonds electronic components to a light-transmissive board through a photo-curable adhesive agent.

2. Background Art

Hitherto, there has been known a bonding apparatus that bonds electronic components, such as an integrated circuit (IC) and a flexible printed circuit (FPC), to a light-transmissive glass substrate (hereinafter sometimes abbreviated as a "substrate") through a photo-curable adhesive agent (see, e.g., JP-A-H09-069543). In such a bonding apparatus, an edge portion of the substrate is supported from below by a supporting surface of a light-transmissive transmission member. An electronic component preliminarily mounted on the edge portion through an adhesive agent is pressed for a predetermined time by a pressure-bonding tool. During pressing, light is emitted toward the adhesive agent from below by a light irradiation unit including a plurality of light-emitting-diodes (LEDs). The emitted light passes through the transmission member and the substrate and reaches the adhesive agent. Accordingly, the electronic component can be pressure-bonded to the substrate at low temperature while the curing of the adhesive agent is promoted.

SUMMARY

Under a configuration in which a mounting board is produced by bonding electronic components to a substrate while light is made incident upon an adhesive agent on the substrate through a transmission member, it is extremely important in mounting-quality to emit light from a light irradiation unit toward a supporting surface of the transmission member uniformly so that luminance is constant in an irradiated area on the supporting surface. Thus, it is necessary to periodically perform by measuring a luminance at each position in the irradiated area. However, there have been no effective means to implement such an inspection.

An aspect of the present invention has been made in view of the above-described circumstances, and an object thereof is to provide a bonding apparatus which allows a user to easily grasp an illuminance distribution of an irradiated area in a supporting surface of a transmission member which supports, from below, a bonding region of a substrate to which an electronic component is bonded through an adhesive agent.

An aspect of the present invention provides a bonding apparatus including: a backup unit including a light-transmissive transmission member having a support surface which supports at least a bonding region of a light-transmissive board from below; a pressure-bonding unit which presses, toward the board, an electronic component placed on the bonding region via a photo-curable adhesive agent such that the electronic component is pressure-bonded to the board; and a light irradiation unit which irradiates the supporting surface from below with light which promotes hardening of the adhesive agent provided between the board and the electronic component, wherein the electronic component is bonded to the board by pressing the electronic component mounted on a top surface of the adhesive agent in a state in which light from the light irradiation unit is incident upon the adhesive agent through the supporting surface, and wherein bonding apparatus further includes a light distribution measuring unit which measures a distribution of light from the light irradiation portion in the supporting surface.

According to an aspect of the present invention, the light distribution measuring unit which measures the distribution of light from the light irradiation portion in the supporting surface. Consequently, a user can easily grasp the illuminance distribution of the irradiated area in the supporting surface of a transmission member.

DETAILED DESCRIPTION

Figure 1:
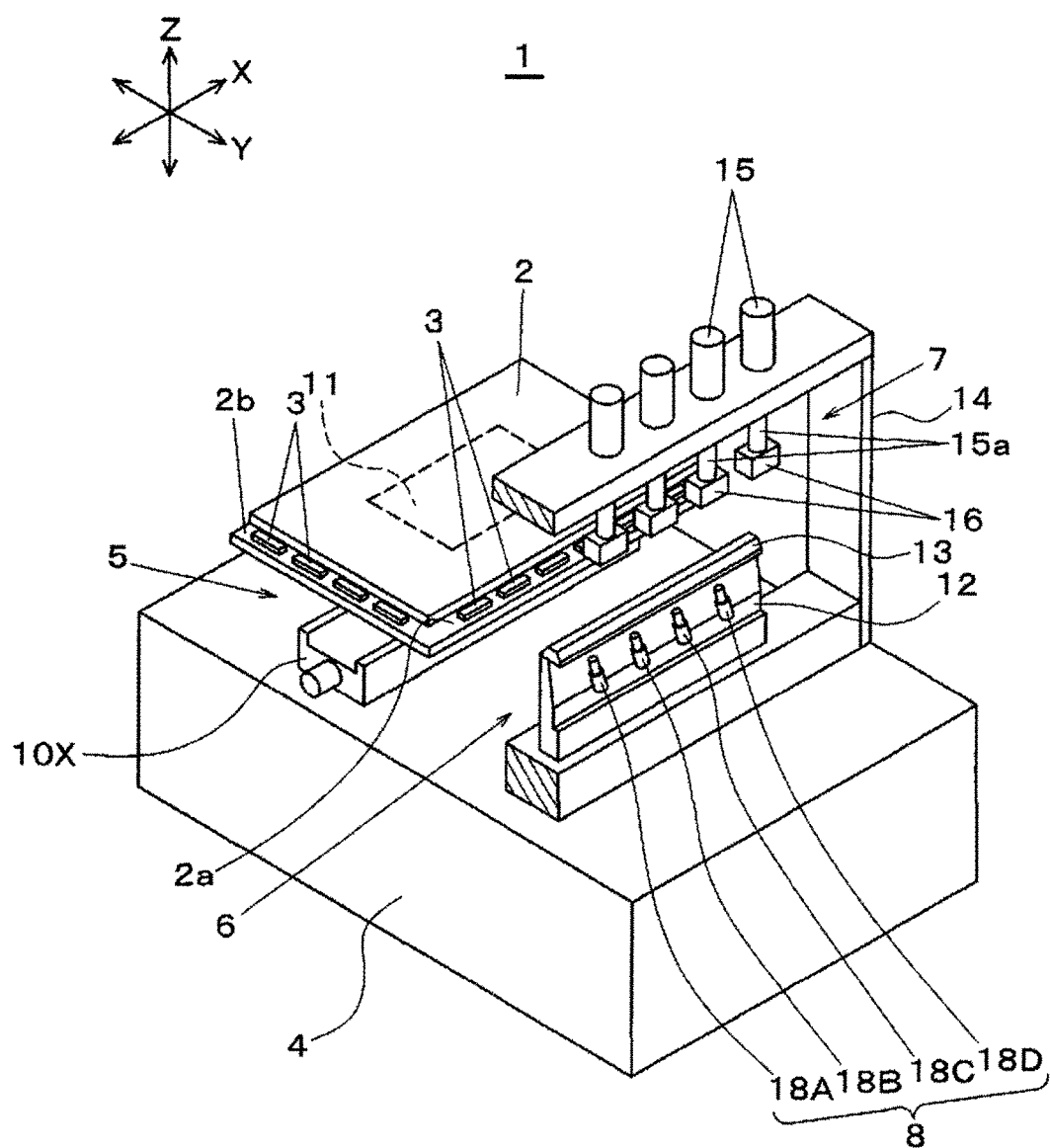
FIG. 1 is a perspective view illustrating a bonding apparatus according to an embodiment of the invention.
Figure 2:
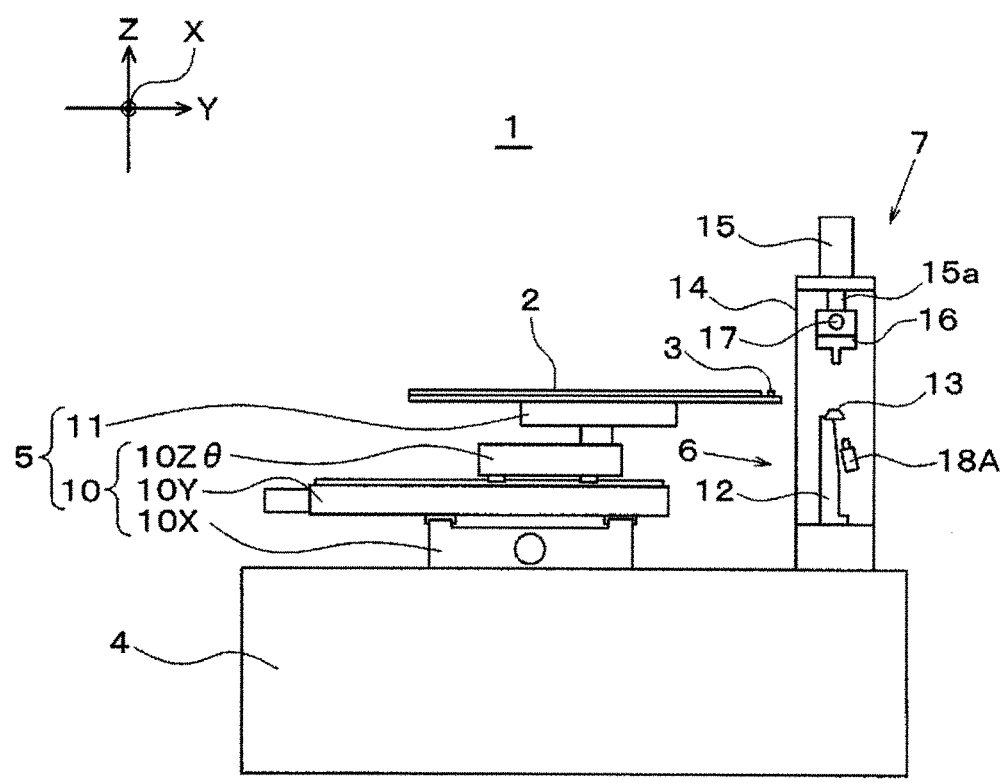
FIG. 2 is a side view of the bonding apparatus according to the embodiment of the invention.

Referring first to FIGS. 1 and 2, the entire configuration of a bonding apparatus according to an embodiment of the invention is described below. A bonding apparatus 1 has the function of pressure-bonding electronic components 3 such as ICs, FPCs (flexible board), and tape carrier packages (TPCs), to a board 2, and is configured by providing a board positioning unit 5, a backup unit 6, a pressure-bonding unit 7, and a light irradiation unit 8 on a base 4. The board 2 is configured by stacking two transparent glass substrates. Into the bonding apparatus 1, the board 2 is loaded, in which a lower-layer-side one of the glass substrates is exposed from plural edge portions 2a and 2b onto which plural electronic components 3 are temporarily pressure-bonded through a photo-curable adhesive agent 9 (see FIGS. 6A to 6C). In the bonding apparatus 1, the electronic components 3 temporarily pressure-bonded onto the edge portion 2a of the board 2 are bonded to the board 2.

In FIG. 2, the board positioning unit 5 has a structure in which a board holding stage 11 is mounted on a board positioning table 10 configured by stacking an X-axis table 10X, a Y-axis table 10Y, and a Zθ-axis table 10Zθ. The Y-axis table 10Y is moved in a horizontal direction (X-direction) by driving the X-axis table 10X. The Zθ-axis table 10Zθ is moved in Y-direction perpendicular to X-direction in a horizontal plane by driving the Y-axis table 10Y. The board holding stage 11 moved up and down in the direction of an axis perpendicular to an XY-plane and rotates around a Z-axis by driving the Zθ-axis table 10Zθ. The board 2 serving as a work object is held on the top surface of the board holding stage 11. The X-axis table 10X and the Y-axis table 10Y configure a horizontal movement mechanism.

Figure 3:
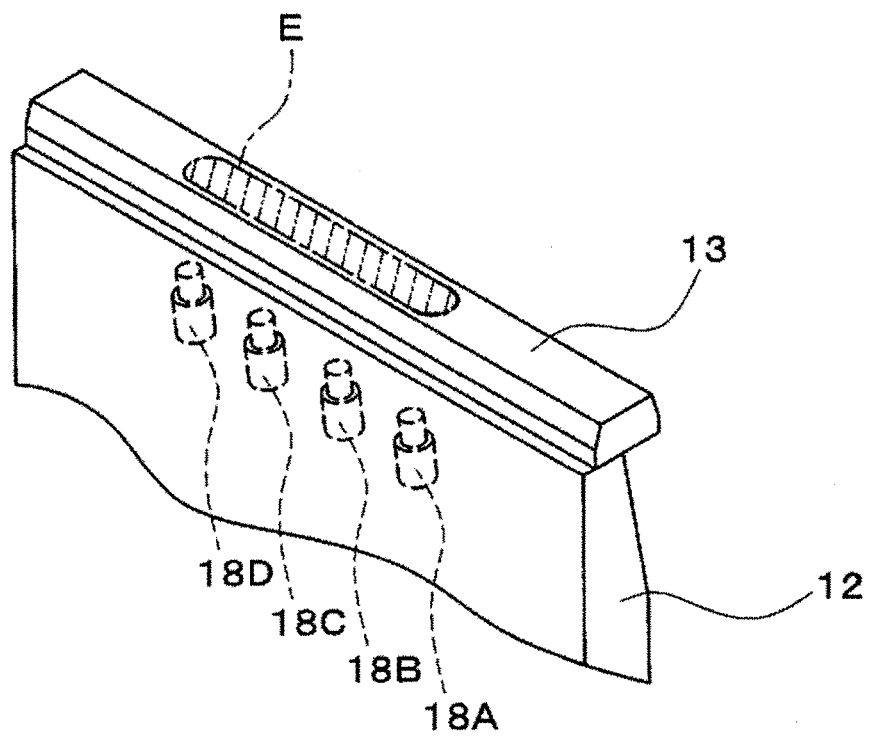
FIG. 3 is a partially perspective view illustrating a backup unit and a light irradiation unit according to the embodiment of the invention.

In FIGS. 2 and 3, the backup unit 6 is configured by providing, on a supporting base 12 extending in X-direction, a block-like transmission member 13 also extending in X-direction. A cutout is formed in the supporting base 12 so as to extend from a side surface to the top surface thereof. A part of the bottom surface of the transmission member 13 protrudes from the supporting base 12 and is in an exposed state.

The top surface of the transmission member 13 serves as a supporting surface that supports, from below, the edge portion 2a of the board 2 positioned at a predetermined pressure-bonding work position by driving the board positioning table 10. Accordingly, the edge portion 2a of the board 2 including a region onto which the electronic components 3 are pressure-bonded is supported by the transmission member 13 when the electronic components 3 are pressure-bonded thereto. Thus, the backup unit 6 includes the light-transmissive transmission member 13 and supports, from below, at least a bonding region of the light-transmissive board 2, onto which the electronic components 3 are bonded, by the supporting surface of the transmission member 13. The board positioning table 10 is a board positioning mechanism for moving the board 2 and for positioning the bonding region, onto which the electronic components 3 are bonded, on the supporting surface.

In FIGS. 1 and 2, the pressure-bonding unit 7 is configured by providing, on a gate frame 14 erected on the base 4, plural pressure-bonding tools 16 which are individually moved up and down by plural lifting pressing mechanisms 15 and which are arranged in X-direction. The transmission members 13 are located below each pressure-bonding tool 16. A heater 17 is built in each pressure-bonding tool 16 and heats the electronic component 3 when the electronic components 3 are pressed.

Each pressure-bonding tool 16 is moved up and down through a rod 15a above the transmission member 13 by driving the lifting pressing mechanism. Consequently, the electronic components 3 can be pressure-bonded to the board 2 by being pressed while the electronic components 3 are heated by the heaters 17. Thus, the pressure-bonding unit 7 pressure-bonds the electronic components 3 to the board 2 by pressing the electronic components 3 preliminarily mounted on the boning region through the light-transmissive adhesive agent 9.

In FIGS. 1, 2, and 3, the light irradiation unit 8 is configured to include plural (four according to this embodiment) light irradiators 18A, 18B, 18C, and 18D. Each of the light irradiators 18A, 18B, 18C, and 18D is provided at a position corresponding to each pressure-bonding tool 16 below the transmission member 13. The light irradiators 18A, 18B, 18C, and 18D irradiate the transmission member 13 from below with light which promotes the curing of the adhesive agent 9 adhering to the electronic components 3 which are in a temporarily pressure-bonded state.

Plural light sources respectively configured by LEDs are built in each of the light irradiators 18A, 18B, 18C, and 18D. The light diffuses within a predetermined range. An irradiated area E on the supporting surface of the transmission member 13 when irradiated with light by all of the light irradiators 18A to 18D includes a region in which the electronic components 3 to be bonded to the edge portion 2a of the board 2 are present. Thus, the light irradiation unit 8 irradiates the supporting surface from below light which promotes the curing of the adhesive agent 9 provided between the board 2 and each electronic component 3.

Next, a photodetector 19 is described hereinafter by referring to FIGS. 4A, 4B, 7A and 7B. The photodetector 19 is used to measure the luminance of light emitted from the light irradiators 18A to 18D within the irradiation area E. In the photodetector 19, a light receiving port 20 (the diameter of which is about 1 to 3 millimeters (mm)) is formed, upon which light is incident. The photodetector 19 is connected by a cable 21 to a control unit 24 (see FIG. 5) provided in the bonding apparatus 1 to be described below.

A light receiving element such as a photodiode is built in the photodetector 19. Light from the light irradiators 18A to 18D, which is received by the light receiving element, is converted into an electrical signal. The electrical signal is converted into a luminance value by an analog-to-digital (AID) conversion circuit or the like built in the photodetector 19. Then, the luminance value is output to the control unit 24 through the cable 21.

When the position of the photodetector 19 is adjusted to above the supporting surface of the transmission member 13, light from the light irradiators 18A to 18D, which is transmitted by the transmission member 13, is incident upon the light receiving element through the light receiving port 20. Consequently, light from the light irradiators 18A to 18D, which is incident upon a predetermined in the irradiated area E below the light receiving port 20, is detected. Thus, the photodetector 19 detects light from the light irradiation unit 8, which is incident upon the predetermined position in the irradiated area E on the supporting surface of the transmission member 13. Incidentally, a range in which the photodetector 19 can detect light is substantially equal in size to the light receiving port 20. Therefore, the intensity of light in an extremely narrow range in which the light receiving port is located can accurately be measured. Thus, in order to know the distribution of light on the entire irradiated area E, it is necessary to detect light at various positions while changing the location of the light receiving port 20 by moving the photodetector 19 above the transmission member 13.

Figure 4A:
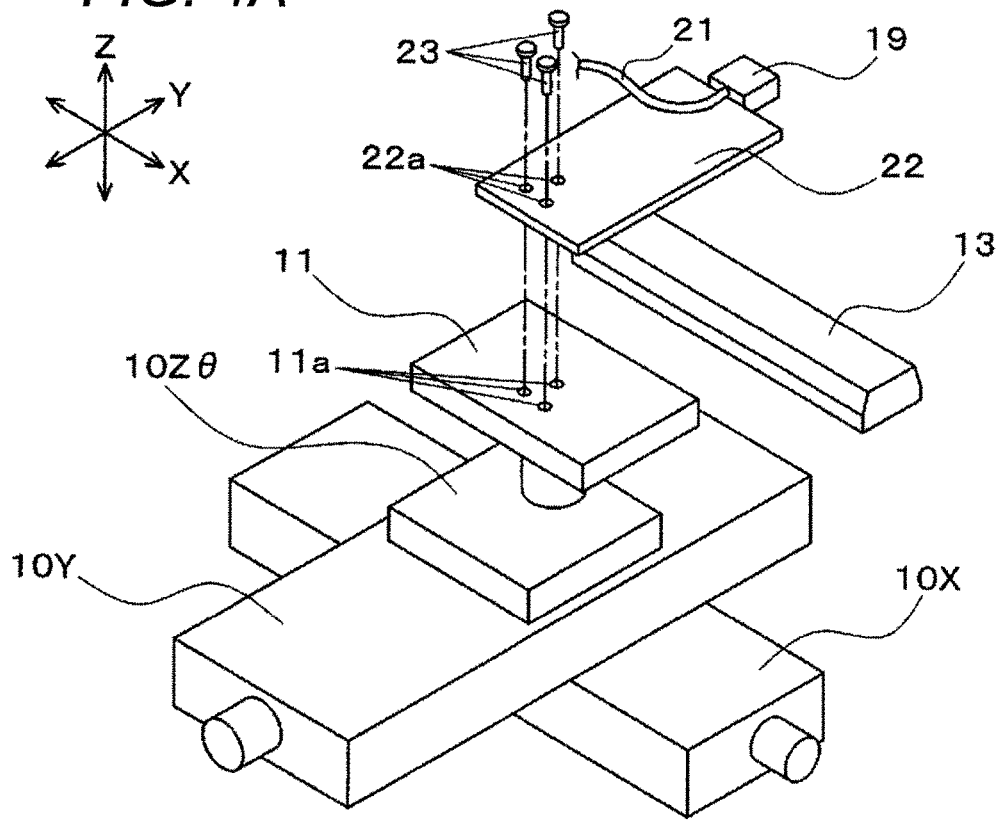
FIGS. 4A and 4B are perspective views illustrating a method for mounting a photodetector according to the embodiment of the invention.
Figure 4B:
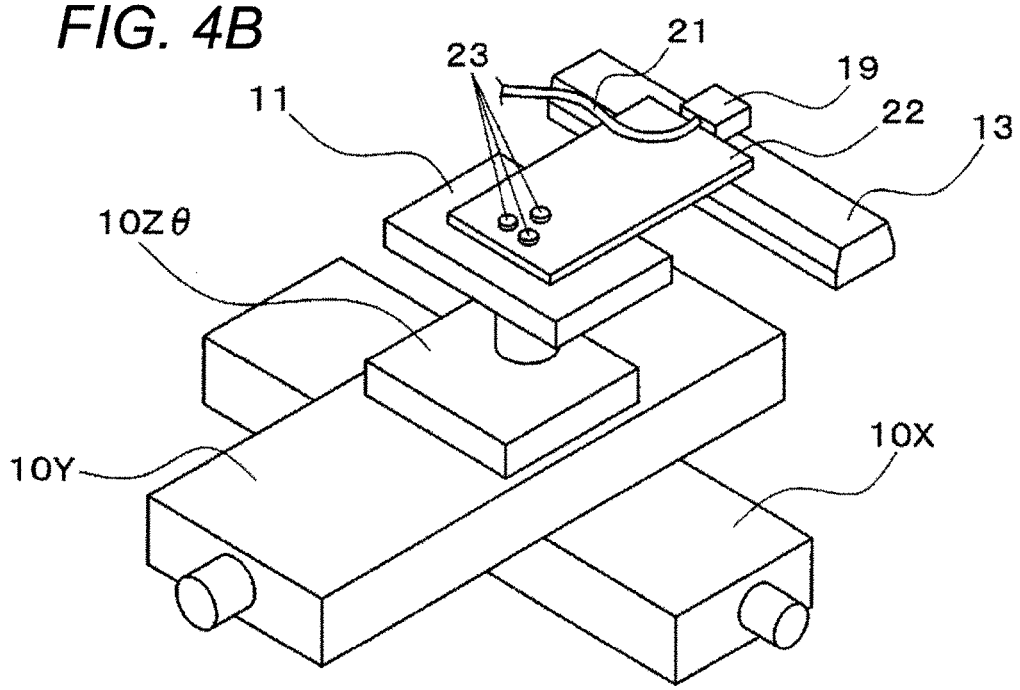

Next, the mounting structure of the photodetector 19 is described hereinafter. In FIGS. 4A and 4B, the photodetector 19 is fixed at an end portion of a rectangular plate-like member 22 in a state in which the light receiving port 20 is exposed. In the plate-like member 22, plural mounting holes 22a vertically penetrating therethrough are formed. In addition, in the board holding stage 11, plural screw holes 11a are formed corresponding to the locations of the mounting holes 22a.

The plate-like member 22 and the board holding stage 11 are overlapped with each other such that each mounting hole 22a and the corresponding screw hole 11a vertically coincide with each other. Each of plural screws 23 is screwed into the corresponding mounting hole 22a and the corresponding screw hole 11a. Thus, the photodetector 19 is fixed to the board holding stage 11 through the plate-like member 22 (see FIG. 4B). The photodetector 19 is detached together with the plate-like member 22 from the board holding stage 11 by releasing the fixation of the photodetector 19 by the screws 23. Thus, the photodetector 19 can detachably be attached to the board positioning table 10. The photodetector 19 can be moved horizontally in X-Y-direction above the transmission member 13 by driving the X-axis table 10X, and the Y-axis table 10Y in a state in which the photodetector 19 is fixed to the board positioning table 10.

In the above configuration, the X-axis table 10X is a first movement table that moves the photodetector 19 in one horizontal direction. The Y-axis table 10Y is a second movement table that moves the photodetector 19 in a direction perpendicular to one horizontal direction in a horizontal plane. The board positioning table 10 also functions as a photodetector moving unit that moves the photodetector 19 above the supporting surface of the transmission member 13, which includes the irradiated area E. That is, the photodetector moving unit also serves as the board positioning mechanism.

Figure 5:
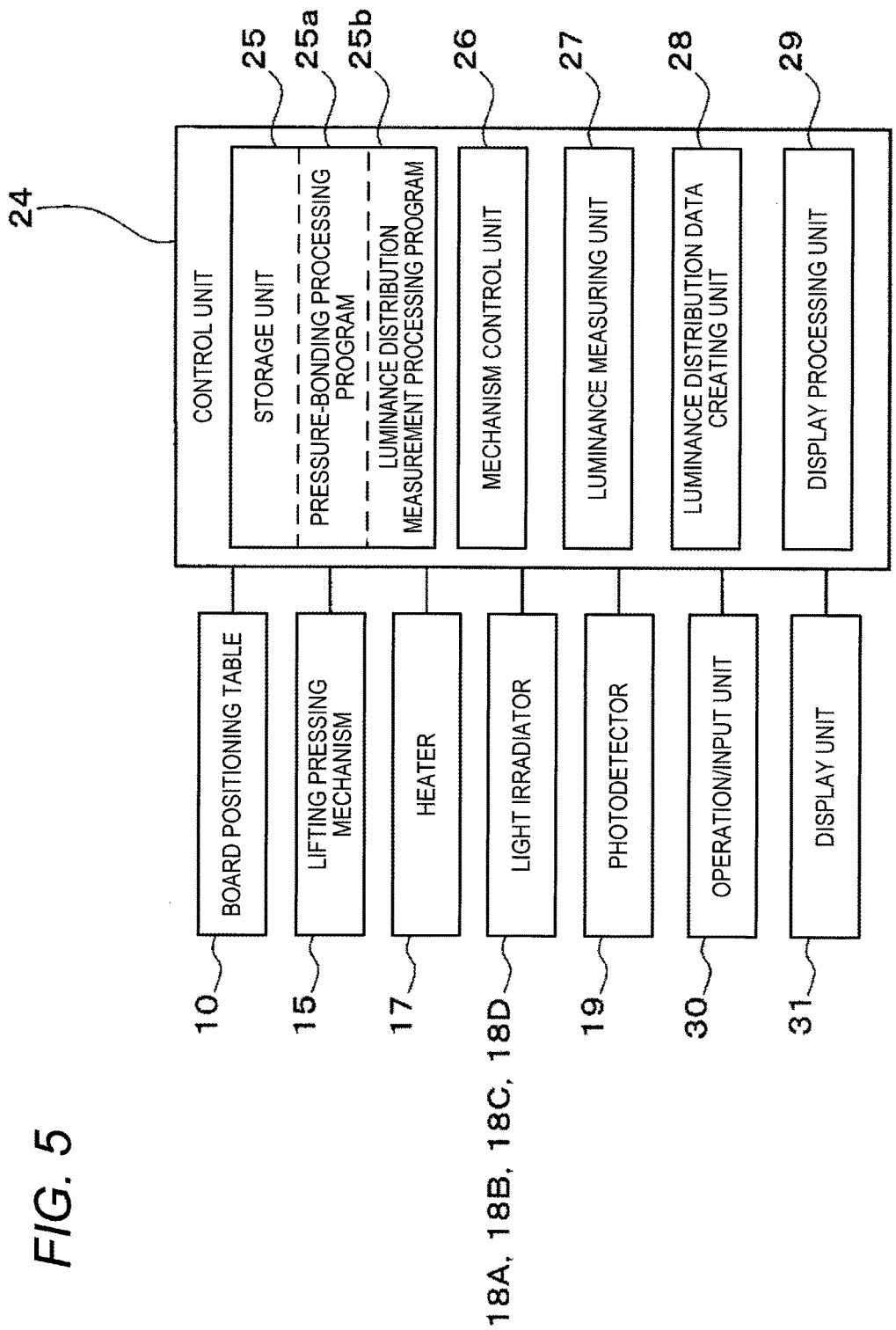
FIG. 5 is a block view illustrating a control system of the bonding apparatus according to the embodiment of the invention.

Referring next to FIG. 5, a control system of the bonding apparatus 1 is described hereinafter. A control unit 24 provided in the bonding apparatus 1 is configured to include a storage unit 25, a mechanism control unit 26, a luminance measuring unit 27, a luminance distribution data creation unit 28, and a display processing unit 29. The control unit 24 is connected to the board positioning table 10, the lifting pressing mechanisms 15, the heater 17, the light irradiators 18A to 18D, an operation/input unit 30, and a display unit 31. The control unit 24 is connected to the photodetector 19 through the cable 21. Incidentally, the photodetector 19 is connected to the control unit 24 only when the luminance is measured.

The storage unit 25 stores a pressure-bonding processing program 25a, and a luminance distribution measurement processing program 25b. The pressure-bonding processing program 25a is an operation program for pressure-bonding the electronic component 3. The pressure-bonding program 25a executes processing for pressure-bonding by referring to board positioning data representing coordinate values used when positioning the board 2, and pressure-bonding position data identifying an order of pressure-bonding the electronic components 3 and the position of each electronic component pressure-bonding point, which are separately stored in the storage unit 25. The luminance distribution measurement processing program 25b is an operation program for creating luminance distribution data by measuring the luminance at each measurement position in the irradiated area E. The luminance distribution measurement processing program 25b executes the measurement of the luminance by referring to coordinate data and so on that correspond to each of plural measurement positions and are separately stored in the storage unit 25.

The mechanism control unit 26 serves as a control unit that activates the board positioning table 10, the lifting pressing mechanism 15, the heater 17, and the light irradiators 18A to 18D, based on commands from the pressure-bonding processing program 25a and the luminance distribution measurement processing program 25b.

The luminance measuring unit 27 causes the storage unit 25 at a request from the luminance distribution measurement processing program 25b to store a luminance value sent from the photodetector 19 by associating the luminance value with the measurement position. The luminance distribution data creating unit 28 creates luminance distribution data including information representing the luminance distribution of the irradiated area E, based on a result of the measurement of the luminance by the luminance measuring unit 27. The luminance distribution data include an image representing the luminance distribution, in which the luminance at each measurement position in the irradiated area E is visually distinguished according to a numerical value. Thus, the luminance distribution data creating unit 28 serves as a luminance distribution data creating unit that creates luminance distribution data, based on the result of the measurement at plural measurement positions in the irradiated area E. The created luminance distribution data are stored in the storage unit 25. According to this embodiment, the photodetector 19, the board positioning table 10, the luminance distribution measurement processing program 25b, the luminance measuring unit 27, and the luminance distribution data creating unit 28 serve as a light distribution measuring unit that measures the distribution of light from the light irradiation unit on the supporting surface.

The display processing unit 29 displays various types of data including luminance distribution data, on the display unit 31. The operation/input unit 30 is an operation/input unit, such as a touch panel, and a mouse, and performs processing such as the designation of an operation to be performed on the display unit 31 and various types of input processing. Thus, the display processing unit 29 and the display unit 31 are luminance distribution display unit for displaying a luminance distribution.

Figure 6A:
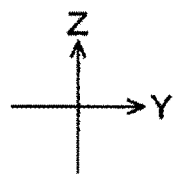
FIGS. 6A, 6B, and 6C are explanatory views illustrating an operation of pressure-bonding electronic components according to the embodiment of the invention.
Figure 6A:
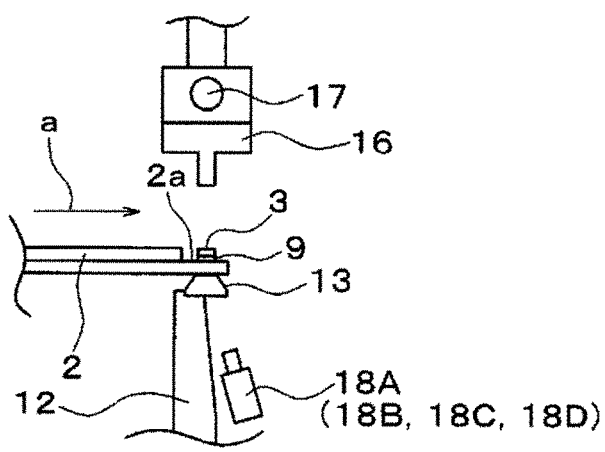
Figure 6B:
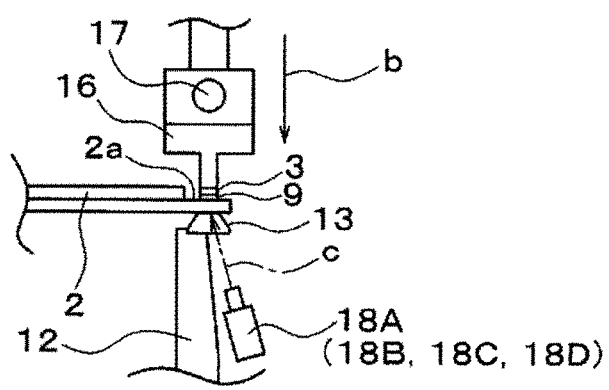
Figure 6C:
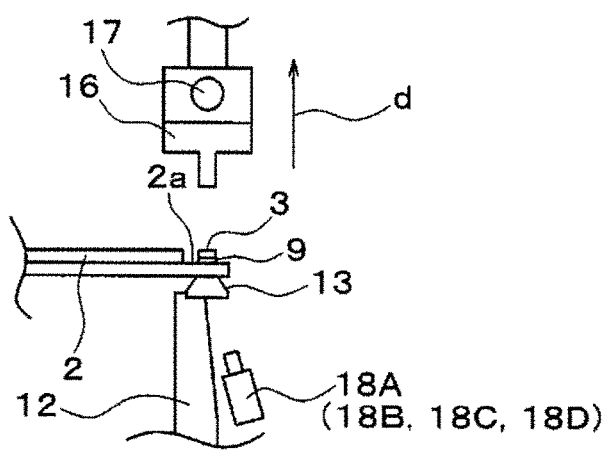

The bonding apparatus 1 according to this embodiment has the above configuration. Referring next to FIGS. 6A, 6B, and 6C, an operation of pressure-bonding the electronic components 3 is described hereinafter. In step ST1 (board positioning step), after the board 2 is loaded into the board holding stage 11, the control unit 24 controls the board positioning table 10 to position the board 2 at a pressure-bonding work position. That is, as illustrated in FIG. 6A, the board positioning table 10 causes the edge portion 2a of the board 2 to touch the transmission member 13 so that the electronic components 3 are located below the pressure-bonding tool 16, as indicated by arrow a.

Next, as illustrated in FIG. 6B, in step St2 (pressing step), the control unit 24 causes the pressure-bonding tool 16 heated by the heater 17 to move down (see arrow b) and press the electronic components 3 for a predetermined time while the electronic components 3 are heated. Around that time, in step ST3 (light irradiation step), the control unit 24 causes the light irradiators 18A to 18D to emit light (see arrow c). The curing of the adhesive agent 9 is promoted by heat of the pressure-bonding tool 16 and light from the light irradiators 18A to 18D. Finally, the electronic components 3 are fixed to the board 2 in a state, in which the electronic components 3 are pressed against the board 2, by the hardened adhesive agent 9.

When the electronic components 3 are pressed for a predetermined time, the control unit 24 stops the emission of light from the light irradiators 18A to 18D, as illustrated in FIG. 6C. Then, the pressure-bonding tool 16 is lifted in step ST4 (see arrow c) (step pressure-bonding tool lifting step)). Through the above steps, the electronic components 3 are pressure-bonded to the board 2 through the cured adhesive agent 9. Thus, the bonding apparatus 1 bonds the electronic components 3 to the board 2 by pressing the electronic components 3 mounted on the top surface of the adhesive agent 9 in a state in which light from the light irradiation unit 8 is incident upon the adhesive agent 9 through the supporting surface.

Figure 7A:
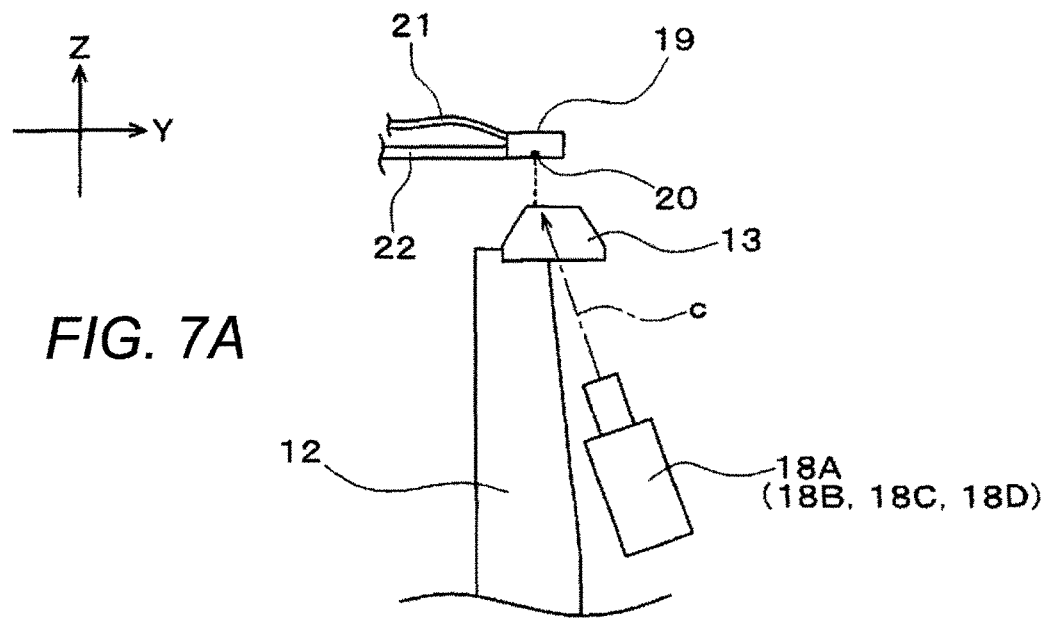
FIGS. 7A and 7B are explanatory views illustrating an operation of measuring illuminance according to the embodiment of the invention.
Figure 7B:
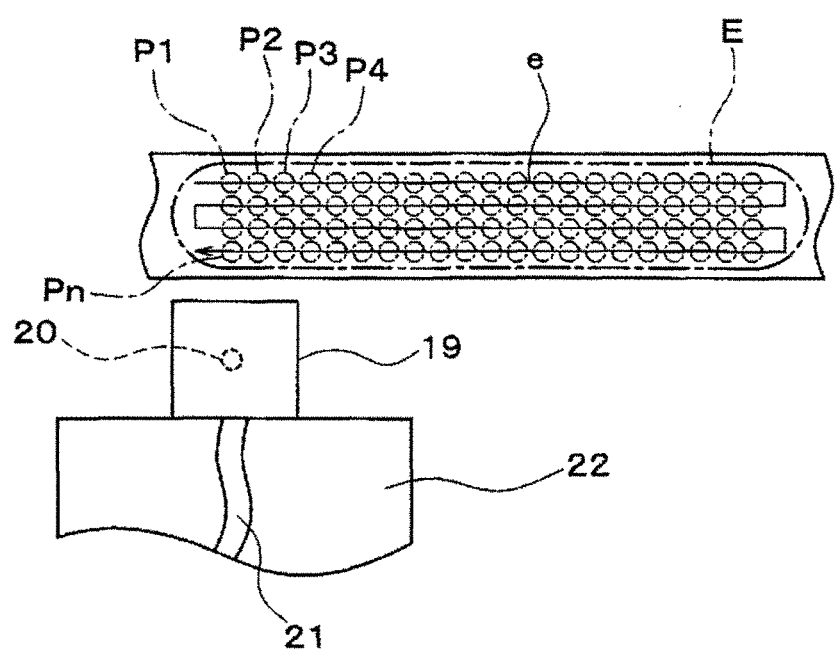
Figure 8:
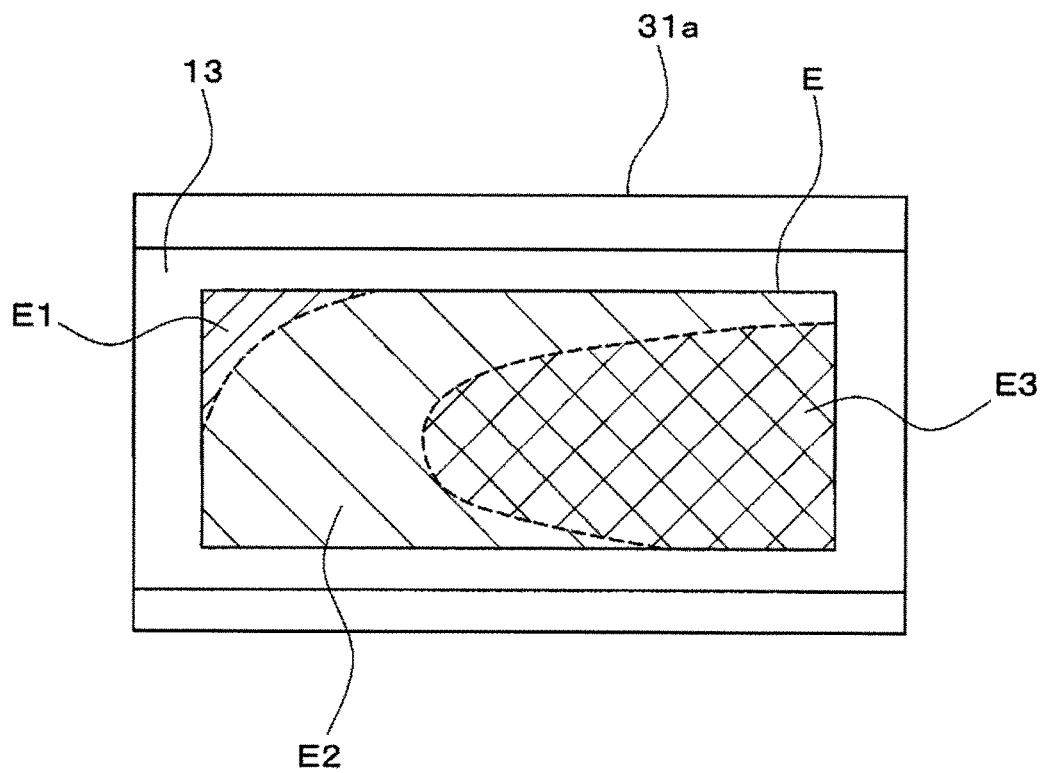
FIG. 8 is a view illustrating a picture displayed on a display unit according to the embodiment of the invention.

Referring next to FIGS. 7A, 7B and 8, a method for measuring the luminance in the bonding apparatus 1 is described hereinafter, which measures light incident from the light irradiation unit 8 upon the supporting surface of the transmission member 13. An operation to be described below is performed in a case where the bonding failures of the electronic component 3 are detected successively at a specific bonding position in an ion performed on the board 2 after the electronic components 3 are bonded to the board 2, in addition to before the production of the apparatus, and to during tooling-change work associated with the change of the type of the board. Before the measurement of the luminance, a worker attaches the photodetector 19 to the board holding stage 11 (see FIG. 4B). Then, the worker operates a measurement start switch (not shown) displayed on the display unit 31. Thus, the measurement of luminance using the luminance distribution measurement processing program 25b is started.

First, as illustrated in FIG. 7A, in step ST11 (light irradiation step), the control unit 24 causes the light irradiators 18A through 18D to emit light. Then, in step ST12 (photodetector positioning step), the control unit 24 moves the photodetector 19 above the irradiated area E on the supporting surface of the transmission member, using the board positioning table 10, so that the light receiving port 20 of the photodetector 19 is positioned at a measurement position set in the irradiated area E.

In this embodiment, a measurement position P1 illustrated in FIG. 7B is set as a measurement start position. First, the control unit 24 moves the photodetector 19 to locate the light receiving port 20 above the measurement position P1. The photodetector 19 detects light coming from the light irradiators 18A through 18D, which is incident from the light receiving port 20.

Next, in step ST3 (luminance measurement step), the control unit 24 measures luminance at the predetermined position in the irradiated area E, based on the detected light. That is, the control unit 24 reads the luminance value representing the luminance of the light detected by the photodetector 19 at the measurement position P1. The measured luminance value is associated with the measurement position P1, and stored in the storage unit 25.

Subsequently, the control unit 24 moves the photodetector 19 in a direction indicated by arrow e in FIG. 7B. Then, the control unit 24 serially measures light from the light irradiators 18A through 18D, which is incident on plural measurement positions P2, P3, P4, . . . , Pn preliminarily set in the irradiated area E, using the photodetector 19.

Thus, the photodetector 19 is moved above the transmission member 13, using the board positioning table 10, so that the luminance in the irradiated area E on the supporting surface of the transmission member 13 can easily be measured. Because the board positioning table 10 of the board for moving the photodetector 19 is diverted as a means for moving the photodetector 19, it is unnecessary to separately provide a mechanism dedicated to move the photodetector 19. The bonding apparatus 1 can be prevented from being complicated. In addition, the manufacturing cost can be reduced.

Upon completion of the measurement of luminance at all measurement positions Pn (n=1, 2, 3 . . . ), in step ST14 (luminance distribution data creating step), luminance distribution data are created, based on a result of the measurement at each measurement position in the irradiated area E. That is, the control unit 24 accesses the storage unit 25 and refers to the luminance at each measurement position Pn in the irradiated area E. Thus, the control unit 24 creates luminance distribution measurement data including an image representing a luminance distribution mapped in the irradiated area E. The created luminance distribution data are stored in the storage unit 25.

Next, in step ST15 (luminance distribution display step), the control unit 24 causes the display unit 31 through the display processing unit 29 to display the luminance distribution in the irradiated area E. As illustrated in FIG. 8, a screen 31a of the display unit 31 displays a part of the supporting surface of the transmission member 13, which includes the irradiated area E, and an image of the luminance distribution, in which the luminance at each measurement position Pn in the irradiated area E is visually distinguished according to the numerical value thereof. According to FIG. 8, it can visually be confirmed that the luminance in an left upper area E1 in the irradiated area E is less than a predetermined luminance, that an area E3 is unnecessarily high in luminance, and that the luminance distribution is uneven over all areas in the irradiated area E including an area E2 that satisfies the predetermined luminance.

The worker can easily determine, by visually checking the luminance distribution displayed on the display unit 31, at what position in the irradiated area E the luminance is low or high, and how the luminance is low or high there. The worker can appropriately adjust a mounting position, a posture, and an output of each of the light irradiators 18A through 18D, based on the luminance distribution.

Upon completion of the operation of adjusting the light irradiators 18A to 18D, the worker performs the measurement of the luminance, causes the display unit to display the luminance distribution on the screen 31a, and checks whether the luminance distribution is improved. Thus, according to the bonding apparatus 1 of the embodiments of the invention, the luminance distribution in the irradiated area E can objectively be grasped. Accordingly, the operation of adjusting the light irradiators 18A to 18D can be performed by the worker efficiently and accurately.

The invention is not limited to the embodiment described so far. For example, various means for measuring the luminance at each position in the irradiated area can be used, as long as can be moved by the photodetector moving unit and has a common function with the photodetector. Alternatively, the bonding apparatus may be adapted so that the control unit has a luminance determination function, and that if the luminance at a predetermined position in the irradiated area is lower (or higher) a predetermined reference value, the worker is notified of this fact by a notification unit, such as a signal tower and a buzzer, provided in the bonding apparatus.

Alternatively, a light irradiator incorporating only one light source, and a large-size light irradiator capable of simultaneously irradiating plural bonding regions with light by being plural light sources arranged in a longitudinal direction of the transmission member can be used as the light irradiation unit. A display mode of the luminance distribution is optional. The luminance distribution image can be displayed three-dimensionally. In addition, although the photodetector 19 is attached to the board positioning mechanism through the plate-like member 22 and the board holding stage 11 in the embodiment of the invention, a method for attaching the photodetector 19 to the board positioning mechanism is not limited to this one and may appropriately be changed within a range apparent to those skilled in the art. For example, a member, to which the photodetector 19 is attached, may be mounted in place of the board holding stage 11 removed from the board positioning mechanism.

According to an aspect of the present invention, the luminance distribution in the irradiated area on the supporting surface of the transmission member can easily be grasped. An aspect of the invention is useful in an electronic component mounting field for pressure-bonding electronic components onto a board through a photo-curable adhesive agent.

What is claimed is:
1. A bonding apparatus comprising:
 a backup unit comprising a light-transmissive transmission member having a support surface which supports at least a bonding region of a light-transmissive board from below;
 a pressure-bonding unit which presses, toward the board, an electronic component placed on the bonding region via a photo-curable adhesive agent such that the electronic component is pressure-bonded to the board; and a light irradiation unit which irradiates the support surface from below with light which promotes hardening of the adhesive agent provided between the board and the electronic component, wherein the electronic component is bonded to the board by pressing the electronic component mounted on a top surface of the adhesive agent in a state in which light from the light irradiation unit is incident upon the adhesive agent through the supporting surface, wherein said bonding apparatus further comprises a light distribution measuring unit which measures a distribution of light from the light irradiation unit in the supporting surface, wherein the light distribution measuring unit comprises:
a photodetector which detects the light from the light irradiation unit and incident upon a given position in an irradiated area of the supporting surface; and
a photodetector moving unit which moves the photodetector to a plurality of measurement positions in the irradiated area, wherein the photodetector moving unit comprises a horizontal movement mechanism comprising: a first movement table which moves the photodetector in a first horizontal direction; and a second movement table which moves the photodetector in a second horizontal direction perpendicular to the first horizontal direction, and wherein the photodetector moving unit also serves as a board positioning mechanism which moves the board to position the bonding region on the supporting surface.

2. The bonding apparatus according to claim 1, further comprising:
a luminance distribution data creating unit which creates luminance distribution data representing a luminance distribution, based on a result of measurement at the plurality of measurement positions in the irradiated area; and
a luminance distribution display unit which displays the luminance distribution.

3. The bonding apparatus according to claim 1, wherein the photodetector is detachably attached to the board positioning mechanism.

* * * * *